United States Patent [19]

Kim et al.

[11] Patent Number: 6,052,193
[45] Date of Patent: Apr. 18, 2000

[54] APPARATUS AND METHOD FOR INSPECTING LOADING STATE OF WAFERS IN CARRIER

[75] Inventors: Yong-cho Kim; Hee-chan Jung, both of Kyungki-do, Rep. of Korea

[73] Assignee: Samsung Electronics Co., Ltd., Suwon, Rep. of Korea

[21] Appl. No.: 09/115,687

[22] Filed: Jul. 15, 1998

[30] Foreign Application Priority Data

Oct. 30, 1997 [KR]  Rep. of Korea ..................... 97-56443

[51] Int. Cl.$^7$ ................................................ G01B 11/00
[52] U.S. Cl. ..................................... 356/388; 250/559.4
[58] Field of Search ................................ 356/388, 386; 414/937, 938, 404, 464, 331; 250/559.4, 223 R

[56] References Cited

U.S. PATENT DOCUMENTS

| | | | |
|---|---|---|---|
| 4,987,407 | 1/1991 | Lee | 414/937 |
| 5,177,564 | 1/1993 | Kato et al. | 356/381 |
| 5,350,899 | 9/1994 | Ishikawa et al. | 356/386 |

*Primary Examiner*—Frank G. Font
*Assistant Examiner*—Tu T. Nguyen
*Attorney, Agent, or Firm*—Jones Volentine, LLP

[57] ABSTRACT

A wafer loading-state inspection apparatus includes a transmissive wafer sensor including a light emitter and a light detector. The light emitter is spaced apart from the light detector in a horizontal plane by a predetermined separation distance. The wafer sensor generates wafer pulses indicating whether a wafer is detected between the light emitter and the light detector. A wafer sensor support has a first arm connected to the light emitter and a second arm connected to the light detector. A vertically oriented post is connected to the wafer sensor support at one end. Connected at the other end of the post is a driving mechanism which produces a reciprocating vertical movement of the post over a vertical range.

20 Claims, 3 Drawing Sheets

APPARATUS AND METHOD FOR INSPECTING LOADING STATE OF WAFERS IN CARRIER

BACKGROUND OF THE INVENTION

1. Field of the Invention

The present invention relates to a semiconductor fabricating apparatus and a method therefor. More particularly, the present invention relates to an apparatus and method for inspecting whether wafers are loaded normally in a carrier when the carrier is supplied to an indexer for another fabrication apparatus.

2. Description of the Related Art

It is known that many wafer processes, including several cleaning processes, are conducted during the fabrication of semiconductor devices. Typically a predetermined number of wafers are loaded into a carrier where the wafers are held in place by a pair of slots along opposite sides of the carrier. During one process, the wafer carrier is provided to an indexer which in turns feeds wafers individually in sequence to the next wafer processing apparatus, for example, a wafer cleaning apparatus such as a spin scrubber. The indexer counts the number of wafers loaded in the carrier; and an indexer arm automatically transfers the wafers from the carrier to the wafer processing apparatus one at a time, in sequence, as controlled by a start signal.

However, a problem occurs if any wafer is improperly positioned in the slots inside the carrier. For example, a wafer may be slanted or inclined, i.e., it may have one side of the wafer in one slot of a pair along one side of the carrier and have the other side of the wafer in a slot of a different pair along the other side of the carrier. If the defectively loaded wafers are handled by an indexer for the following apparatus, such as a spin scrubber, the wafers or parts of the next apparatus may be damaged. Then the operation of the processing equipment has to be stopped and productivity at the fabrication facility is decreased.

SUMMARY OF THE INVENTION

Objects of the present invention are to provide a method and an apparatus for inspecting the loading states of wafers in a carrier, before a following process such as a cleaning process using a spin scrubber, in order to prevent damage either to the wafers or to the equipment parts for the following process.

To accomplish these and other objects and to achieve other advantages in semiconductor fabrication, the present invention provides a wafer loading-state inspection apparatus including a transmissive wafer sensor having a light emitter and a light detector spaced apart from each other in a horizontal plane by a predetermined separation distance. The wafer sensor generates wafer pulses indicating whether a wafer is detected between the light emitter and the light detector. The apparatus also includes a wafer sensor support having a first arm connected to the light emitter and a second arm connected to the light detector. A vertically oriented post is connected at one end to the wafer sensor support. Connected at the other end of the post is a driving mechanism which produces a reciprocating vertical movement of the post over a vertical range.

In another aspect of the present invention, the wafer loading-state inspection apparatus further includes a vertical, fixed bar having a plurality of slots spaced at a constant interval along the vertical direction, and having a length at least as great as the vertical range of the post. A photo sensor, rigidly connected to the post, is in optical communication with the bar over the vertical range of the post, for generating reference pulses indicating whether the photo sensor is aligned with a slot of the plurality of slots on the bar. A pulse comparator compares the wafer pulses with the reference pulses to generate a signal indicating whether there is consistency between the wafer pulses and the reference pulses.

Another aspect of the present invention provides a method for inspecting the wafer loading-state of a carrier. The wafer loading-state inspection method includes rotating a wafer carrier so that a plurality of wafers loaded in respective wafer slots are horizontally oriented. The method includes detecting the presence and absence of any one of the plurality of wafers using a wafer sensor which transmits light horizontally on a light path from a light emitter at a first open side of the carrier to a light detector at a second open side of the carrier. Then the method involves generating wafer pulses from the wafer sensor in an ON state when a wafer is present in the light path, whereby the light is blocked before it can be detected by the light detector, and in an OFF state when a wafer is absent from the light path, whereby the light is detected by the light detector. Reference pulses are generated to be in an ON state when a wafer should be present in the light path and in an OFF state when a wafer should be absent from the light path. Then the wafer pulses are compared to the reference pulses. An alarm warns when the state of one of the wafer pulses is not equal to the state of a corresponding one of the reference pulses.

According to the present invention, the states of wafers loaded in the carrier are inspected before a subsequent wafer process, so that damage is prevented either to the wafers or to the equipment parts for the subsequent process. As a result, a reduction in productivity of semiconductor device manufacturing can be prevented.

BRIEF DESCRIPTION OF THE DRAWINGS

The accompanying drawings illustrate the embodiments of the invention, in which.

DETAILED DESCRIPTION OF THE INVENTION

Figure 1:
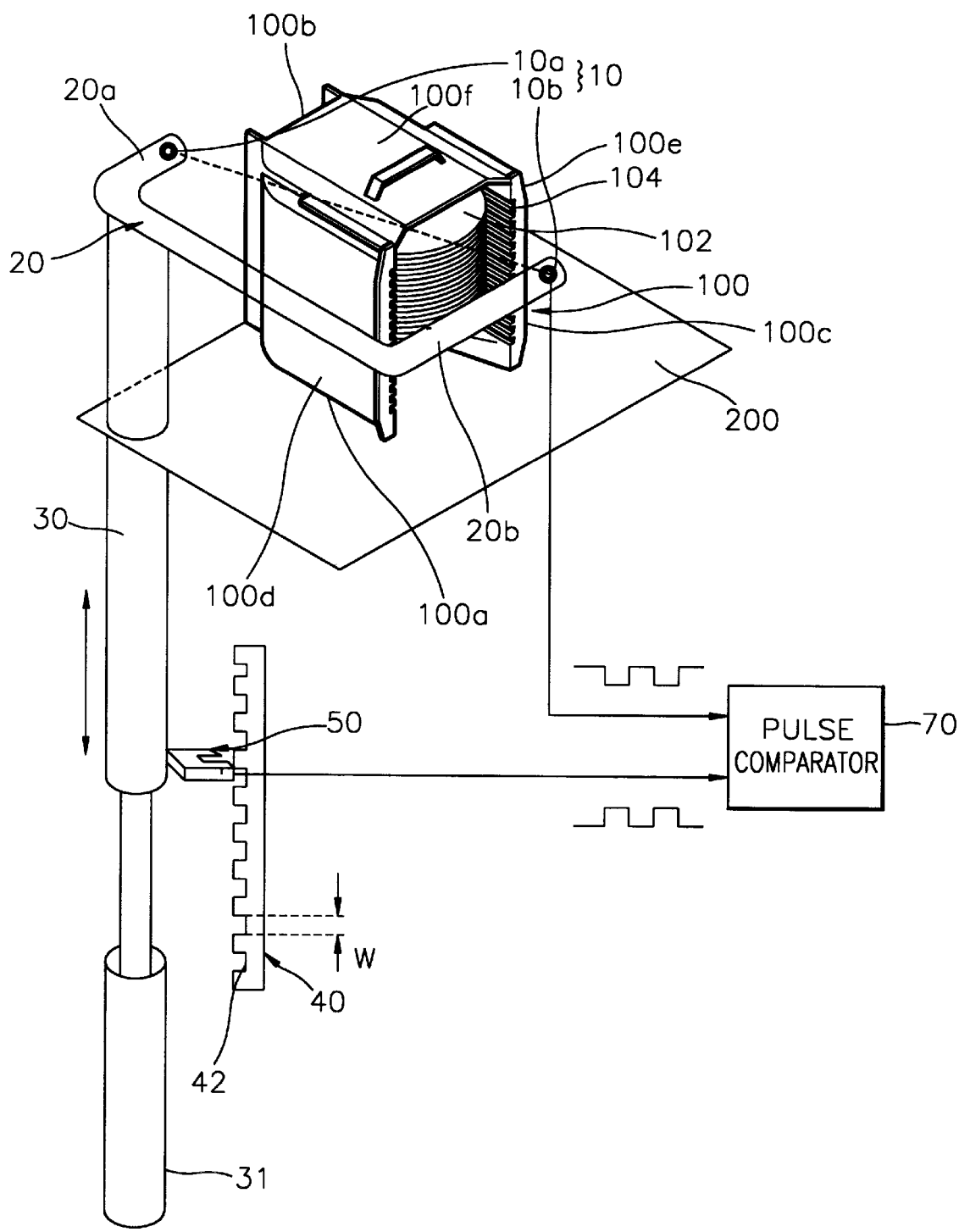
FIG. 1 is a perspective view showing the configuration of an apparatus for inspecting the loading state of wafers, according to a preferred embodiment of the present invention.

Referring to FIG. 1, an apparatus for inspecting the states of loaded wafers according to the present invention includes a transmissive wafer sensor 10 having a light emitter 10a and a light detector 10b. The light emitter 10a and light detector 10b are installed on the respective ends of two arms 20a and 20b branching from a wafer sensor support 20. The light emitter 10a is installed on a first arm 20a and the light detector 10b is installed on a second arm 20b.

The present invention has the purpose of inspecting the state of wafers 102 loaded into a wafer carrier 100. A typical wafer carrier 100 has a box-like shape with an open upper entrance side 100c through which wafers 102 are loaded into and removed out of the carrier 100, and a partially open lower side 100b opposite the entrance side 100c so that the wafers 102 will not pass. Two carrier side walls 100d and 100e have a plurality of slots 104 provided therein for holding the wafers 102. The slots 104 are arranged in pairs with one slot 104 of each pair on one side wall 100d and the other slot 104 of the pair on the opposite side wall 100e aligned so the pair of slots define a slot plane perpendicular to the side walls 100d, 100e. The carrier is designed to have each wafer 102 reside substantially within the slot plane defined by the corresponding slots 104 on the opposing side walls 100d, 100e. The remaining portions of the carrier 100 include opposing carrier ends 100a and 100f.

Generally, when the carrier 100 is in the carry or transfer orientation, the upper entrance side 100c faces upwardly and the lower side 100b faces downwardly. However, in the preferred embodiment, as shown in FIG. 1, the carrier 100 is rotated 90° so that its end surface 100a becomes the bottom, and the slots 104 and wafer lie in the horizontal plane. While the invention is described with respect to this horizontal orientation, it is contemplated that the present invention is equally applicable to inspecting the load state of vertically oriented wafers, as long as the direction from the light emitter 10a to the light detector 10b is parallel to the slot plane, and as long as the light emitter 10a and light detector 10b are disposed along the opposing upper 100c and lower 100b sides. For the purposes of the following description, the slot plane is called the horizontal plane, and the direction perpendicular to the slot plane is called the vertical direction.

In the preferred embodiment, the two arms 20a and 20b of the wafer sensor support 20 are parallel to, and spaced from, each other, so that the wafer sensor support 20 has an overall shape like a square-cornered letter C. Also, the light emitter 10a and light detector 10b of the wafer sensor 10 are separated by a predetermined distance sufficient to fit a carrier 100 therebetween.

In the preferred embodiment, light from the light emitter 10a must be transmitted to the light detector 10b in a diagonal direction as the light progresses from the partially open lower side 100b of the carrier 100 to the open upper entrance side 100c of the carrier 100. That is, the light emitter 10a must be closer to the first side wall (100d or 100e) than to the second side wall (100e or 100d, respectively), and the light detector 10b must be closer to the second side wall (10e or 10d, respectively) than to the first side wall (100d or 100e, respectively). To accomplish the diagonal light transmission, the parallel arms 20a and 20b of the wafer sensor support 20 are of different lengths.

One reason why the light from the light emitter 10a must be transmitted in a diagonal direction inside the carrier 100 in the preferred embodiment is as follows. The wafers 102 inside the carrier 100 each have flat zones which are randomly oriented, so the wafers can be slightly inclined in the carrier 100 due to minute differences in the centers of gravity of the wafers depending on the locations of the flat zones. For example, when the flat zone of a wafer 102 faces the side wall 100d of the carrier 100, the wafer 102 may be slightly inclined, resting down in the slot at the wafer edge nearest one side wall 100d, but raised in the slot at the wafer edge nearest the opposite side wall 100e. Although the wafer 102 in such a case is properly loaded in a slot pair of the carrier 100, it may go undetected, indicating no wafer in the slot pair, if the emitter and detector were both located near the opposite side wall 100e. In order to prevent such a detection error, the light from the light emitter 10a is transmitted in the diagonal direction through the carrier 100 in which the wafers 102 are loaded. Thus, errors due to variations in the orientations of the flat zones of the wafers can be minimized.

Another advantage of the diagonal transmission in the preferred embodiment is that the wafer sensor 10 should not fail to detect a wafer 102 that is slanted in the carrier 100, i.e., abnormally slanted in that it does not reside in corresponding aligned slots 104 defining a slot plane. For instance, the flat zone of the wafer 102 may properly reside in the slot 104 along the entire side wall 100d while the other end of the wafer 102 resides in a non-aligned slot 104 on the other side wall 100e. If both emitter 10a and detector 10b were near the same side wall 100d of the carrier 100, the light detector 10b would indeed receive the light from the light emitter 10a between slots 104, indicating that no wafer is present between slots 104, even though the wafer 102 is improperly loaded in the carrier 100. Thus, if the emitter 10a did not transmit diagonally to the detector 10b, the improperly loaded wafer would go unnoticed. However, with the diagonal transmission of the preferred embodiment, the diagonal light beam would contact the slanted wafer 102, indicating that the wafer 102 is improperly loaded. Thus, when the emitter 10a transmits diagonally to the detector 10b, the improperly loaded wafer 102 would be detected and corrective action would be taken to avoid damage or delay.

In the present invention, the wafer sensor 10 generates wafer pulses indicating whether a wafer 102 is detected between the light emitter 10a and the light detector 10b. That is, if the wafers 102 are loaded properly in slots 104 in the carrier 100, the light from the light emitter 10a passes through spaces between adjacent wafers 102, corresponding to intervals between adjacent pairs of slots 104, and reaches the light detector 10b. When this occurs, the wafer sensor 10 generates wafer pulses in the OFF state indicating that no wafer 102 exists in the light path between the light emitter 10a and the light detector 10b. Alternately, when the light from the light emitter 10a is blocked by a properly loaded wafer 102, the wafer sensor 10 generates wafer pulses in the ON state indicating that a wafer 102 exists in the light path between the light emitter 10a and light detector 10b. Properly loaded wafers will therefore cause the wafer sensor to produce a wafer signal that alternates between the OFF and ON states.

As described above, if a wafer 102 is loaded improperly, e.g., if the wafer 102 is slanted across non-aligned slots, then at least a part of the space between adjacent slot pairs is blocked by the improperly-loaded wafer 102. Consequently, light from the light emitter 10a is blocked by the wafer 102, and the wafer sensor 10 generates wafer pulses in the ON state indicating that a wafer exists in the light path between the light emitter 10a and light detector 10b. One of ordinary skill can appreciate that the particular ON and OFF states associated with a present or absent wafer, and any associated low and high voltage levels, were arbitrarily selected; therefore, a different definition of states and voltage levels may be employed.

As shown in FIG. 1, the wafer sensor support 20 may itself be supported by a post 30 which can be moved in a vertically reciprocating manner, i.e., upward or downward, by a driving mechanism. In the preferred embodiment the driving mechanism is an air cylinder 31, although any conventional driving mechanism may be employed. When the post 30 moves upward, the wafer sensor support 20 moves upward and the loading states of the wafers 102 are measured in sequence by the wafer sensor 10 from the bottom wafer 102 in the carrier 100 to the top wafer 102 in the carrier 100. The wafer sensor 10 thus produces a series of wafer pulses having either ON or OFF states. Alternatively, the wafer pulses can be produced as the post 30 moves downward carrying the wafer sensor 10 downward past the wafer carrier 100 from the top wafer 102 to the bottom wafer 102 in the carrier 100.

To provide an apparatus for checking the operation of the wafer sensor 10, a vertical, fixed slotted bar 40 is installed parallel and in close proximity to the post 30. A plurality of slots 42 are formed in the bar 40 and spaced at a regular interval along its length. The number of bar slots 42 is the same as the number of slots 104 in the carrier, and the length of the slotted bar 40 is at least as great as the vertical range of movement of the post 30. A photo sensor 50 is rigidly attached to the post 30 so as to follow the vertical movement of the post 30. The photo sensor 50 optically communicates with the bar 40 throughout the vertical movement of the post 30. When the photo sensor 50 is aligned with a bar slot 42, light is detected. Thereby, the photo sensor 50 generates references pulses indicating alignment with the slots 42. That is, when light to the photo sensor 50 passes through a slot 42 of the slotted bar 40, the photo sensor 50 is aligned with the bar slot 42 and the photo sensor 50 generates a reference pulse in the ON state; but, when light to the photo sensor 50 is blocked by a portion of the slotted bar 40 without a slot, the photo sensor is not aligned with a bar slot 42, and the photo sensor 50 generates a reference pulse in the OFF state. Again, the particular ON and OFF states associated with a present or absent wafer, and any associated high and low voltage levels, were arbitrarily selected; therefore, a different definition of states and voltage levels may be employed. In the preferred embodiment each of the bar slots 42 has a vertical length, W, of 2±0.1 mm which is substantially equal to the width of the slots 104 in the wafer carrier. Though W is substantially equal to the width of the carrier slots 104 in the preferred embodiment, clearly one can employ a gearing mechanism that changes the ratio between post movement and movement of the photo sensor 50 to a new value, in which case the new ratio must apply between the width of the carrier slots 104 and W.

While the invention is described as having a photo sensor 50, it is contemplated that the photo sensor 50 can include only a detector or can include both a photo-emitter and a photo-detector. If both a photo-emitter and a photo-detector are included, the bar passes light from the photo-emitter to the photo-detector when the photo sensor 50 is aligned with a slot on the bar 40, and light from the photo-emitter is blocked when the photo sensor is not aligned with a slot on the bar.

A pulse comparator 70 compares the ON/OFF pulses generated by the wafer sensor 10, i.e., the wafer pulses, with the ON/OFF pulses generated by the photo sensor 50, i.e., the reference pulses. The pulse comparator 70 generates an alarm when the ON or OFF pulses are not consistent. That is, the pulse comparator 70 generates an alarm when the state of one of the wafer pulses is not equal to the state of a corresponding one of the reference pulses FIGS. 2A and 2B show examples of wafer pulses generated by the wafer sensor 10.

Figure 2A:
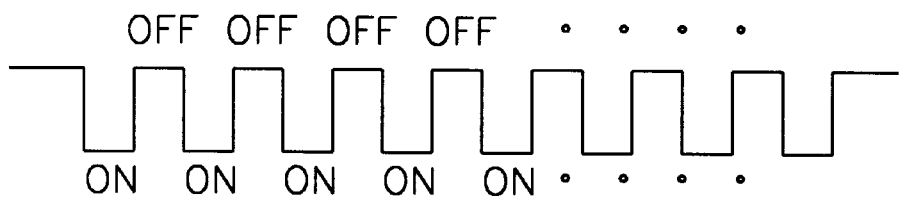
FIGS. 2A and 2B are examples of wafer pulses generated by a wafer sensor for two different wafer loading states, in which FIG. 2A corresponds to a normal loading state and FIG. 2B corresponds to an abnormal loading state.

FIG. 2A shows wafer pulses when wafers are loaded properly in the carrier. As described, an ON state indicates that a wafer is located in the light path between the light emitter 10a and light detector 10b, and an OFF state indicates that a wafer is not detected in the light path.

Figure 2B:
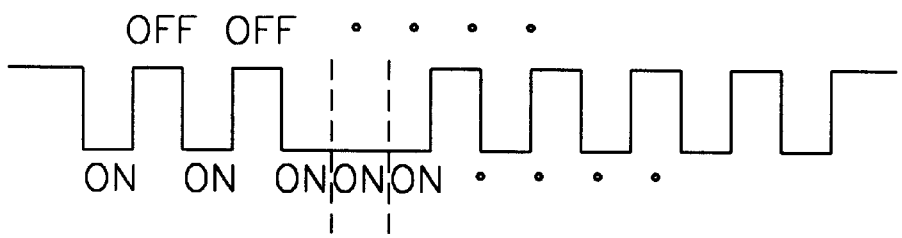

FIG. 2B shows pulses generated when a wafer is located in the space between the third and fourth slots in the carrier 100. That is, the three sequential ON pulses denote that a wafer is loaded improperly between the third and fourth slots.

Figure 3:
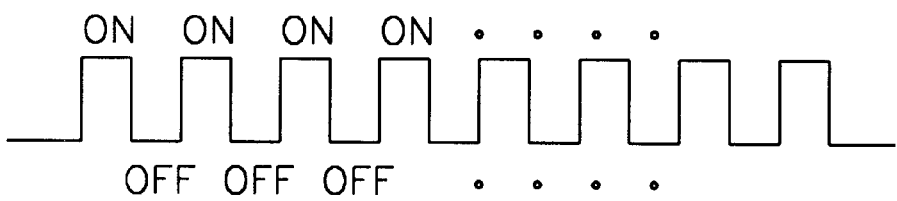
FIG. 3 shows reference pulses generated by a photo sensor.

FIG. 3 shows reference pulses generated from the photo sensor 50. Because the slotted bar 40 is fixed, the reference pulses are always the same.

Figure 4A:
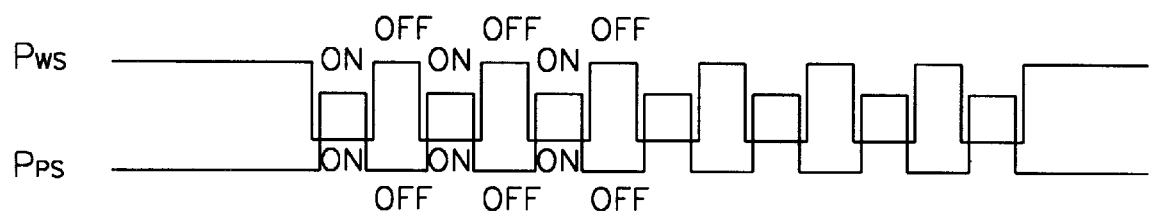
FIGS. 4A and 4B show comparisons of wafer pulses with reference pulses, in which FIG. 4A corresponds to the case when wafers are normally loaded in a carrier and FIG. 4B corresponds to an abnormal case.
Figure 4B:
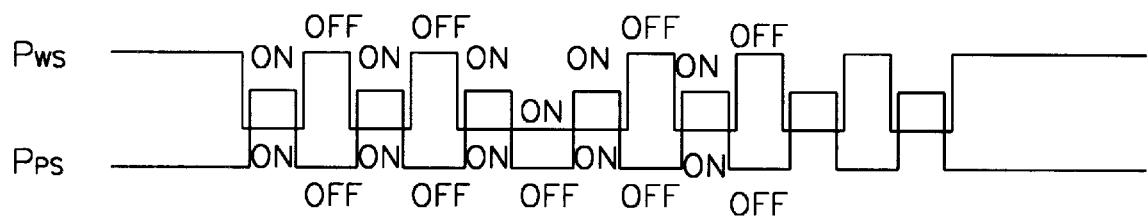

FIGS. 4A and 4B are comparisons of wafer pulses (Pws) generated by the wafer sensor 10 with reference pulses (Pps) generated by the photo sensor 50. FIG. 4A shows the comparison when the wafers are loaded properly in the carrier. FIG. 4B shows the comparison when a wafer is improperly loaded in the space between the third and fourth slots in the carrier.

The pulse comparator 70 compares the wafer pulses with the reference pulses as shown in FIGS. 4A and 4B, and warns of a failure in a wafer loading state by generating an alarm when the state of a pulse generated by the wafer sensor 10 is not identical to that of the corresponding pulse generated by the photo sensor 50.

In the preferred embodiment, the wafer loading-state inspection apparatus is installed on an indexer 200 of a spin scrubber. In this case, the wafer loading-state inspection apparatus is operated to detect a loading defect before a wafer cleaning process begins. When an alarm is generated by the pulse comparator 70, an operator immediately checks the wafers in the carrier 100, and reloads the improperly-loaded wafer correctly. Then the wafer cleaning process is performed. As a result, damage to the wafers and damage to the equipment parts can be prevented.

The method of inspecting the loading state of a wafer carrier is carried out as follows. A wafer carrier is rotated 90° so that the wafers and wafer slots are oriented horizontally, such that the open upper entrance faces to one side.

Next, the presence and absence of any one of the plurality of wafers is detected using a wafer sensor which transmits light horizontally from a light emitter at a first open surface of the carrier diagonally to a light detector at a second open surface of the carrier. Wafer pulses from the wafer sensor are generated in an ON state when a wafer is present in the light path, i.e., when the light is blocked before it can be detected by the light detector. Wafer pulses are generated in an OFF state when a wafer is absent from the light path, i.e., when the light is detected by the light detector.

Then, the wafer pulses are compared with reference pulses which are predetermined to be in an ON state when a wafer should be present in the light path and in an OFF state when a wafers should be absent from the light path. Finally, an alarm warns when the state of one of the wafer pulses is not equal to the state of a corresponding one of the reference pulses.

In the preferred embodiment, the method of the present invention checks whether the wafers are correctly loaded in the carrier using a wafer sensor having a light emitter and a light detector and a photo sensor, while the wafer carrier is installed on an indexer for a spin scrubber prior to a wafer cleaning process. Thus, damage to the wafers and to the equipment parts of the scrubber is prevented, and the productivity of semiconductor device manufacturing is increased.

Although the present invention has been described in detail using examples and preferred embodiments, it is not limited to these embodiments. Various modifications may be made by those skilled in the art without departing from the technical spirit and scope of the present invention as defined by the appended claims and their equivalents.

What is claimed is:

1. A wafer loading-state inspection apparatus comprising:
   a wafer sensor support having first and second spaced apart arms extending in a horizontal plane substantially parallel to one another;
   a transmissive wafer sensor comprising a light emitter supported on said first arm and a light detector supported on said second arm and spaced apart from each other in said horizontal plane by a predetermined separation distance, said light emitter and said light detector oriented to face each other along a line intersecting the arms of said wafer sensor support at acute angles, respectively, whereby light from said light emitter propagates in said horizontal plane towards said light detector diagonally across a space defined between the parallel arms of said wafer sensor support, and the wafer sensor generating wafer pulses indicating whether a wafer is detected between the light emitter and the light detector;
   a post oriented vertically and connected at one end to the wafer sensor support; and
   a driving mechanism connected to an opposite end of the post, for producing reciprocating vertical movement of the post over a vertical range.

2. The wafer loading-state inspection apparatus of claim 1, wherein the length of the first arm is different than the length of the second arm.

3. The wafer loading-state inspection apparatus of claim 1, wherein the driving mechanism is an air cylinder.

4. The wafer loading-state inspection apparatus of claim 1, wherein the wafer sensor is installed on an indexer of a wafer cleaning apparatus.

5. The wafer loading-state inspectin apparatus of claim 4, wherein the wafer cleaning apparatus is a spin scrubber.

6. A wafer loading-state inspection apparatus comprising:
   a transmissive wafer sensor comprising a light emitter and a light detector spaced apart from each other in a horizontal plane by a predetermined separation distance, the wafer sensor generating wafer pulses indicating whether a wafer is detected between the light emitter and the light detector;
   a wafer sensor support having a first arm connected to the light emitter and a second arm connected to the light detector;
   a post oriented vertically and connected at one end to the wafer sensor support;
   a driving mechanism connected to an opposite end of the post, for producing reciprocating vertical movement of the post over a vertical range;
   a vertical, fixed bar disposed adjacent to the post, the bar having a plurality of slots spaced at a constant interval along the vertical direction, the bar having a length at least as great as the vertical range of the post;
   a photo sensor rigidly connected to the post in optical communication with the bar over the vertical range of the post, for generating reference pulses indicating whether the photo sensor is aligned with a slot of the plurality of slots on the bar; and
   a pulse comparator for comparing the wafer pulses with the reference pulses and for generating a signal indicating whether there is consistency between the wafer pulses and the reference pulses.

7. The wafer loading-state inspection apparatus of claim 6, wherein the first arm of the wafer sensor support is substantially parallel to the second arm in a horizontal plane and the predetermined separation distance is sufficient to allow a carrier with a plurality of wafers to be positioned between the light emitter and the light detector.

8. The wafer loading-state inspection apparatus of claim 7, wherein the length of the first arm is different than the length of the second arm.

9. The wafer loading-state inspection apparatus of claim 6, wherein the wafer pulses are in an ON state when a wafer blocks light transmission between the light emitter and the light detector, and are in an OFF state when a wafer does not block transmission.

10. The wafer loading-state inspection apparatus of claim 9, wherein the reference pulses are in an ON state when the photo sensor is aligned with a slot, whereby light passes through a slot of the plurality of slots on the bar as to be detected by the photo sensor, and are in an OFF state when the photo sensor is not aligned with a slot.

11. The wafer loading-state inspection apparatus of claim 10, wherein the pulse comparator generates an alarm signal when the state of one of the wafer pulses is not equal to the state of a corresponding one of the reference pulses.

12. The wafer loading-state inspection apparatus of claim 6, wherein each slot of the plurality of slots has a vertical length in the range from about 1.9 millimeters to about 2.1 millimeters.

13. The wafer loading-state apparatus of claim 6, wherein the driving mechanism is an air cylinder.

14. The wafer loading-state inspection apparatus of claim 6, wherein the wafer sensor is installed on an indexer of a wafer cleaning apparatus.

15. The wafer loading-state inspection apparatus of claim 6, wherein the wafer cleaning apparatus is a spin scrubber.

16. A wafer loading-state inspection method comprising:
   rotating a wafer carrier so that a plurality of wafers loaded in respective wafer slots are horizontally oriented;
   detecting the presence and absence of any one of the plurality of wafers using a wafer sensor which transmits light horizontally on a light path from a light emitter at a first open side of the carrier to a light detector at a second open side of the carrier;
   generating wafer pulses from the wafer sensor in an ON state when a wafer is present in the light path, whereby the light is blocked before it can be detected by the light detector, and in an OFF state when a wafer is absent from the light path, whereby the light is detected by the light detector;
   generating reference pulses predetermined to be in an ON state when a wafer should be present in the light path and in an OFF state when a wafer should be absent from the light path;
   comparing the wafer pulses with the reference pulses; and
   warning with an alarm when the state of one of the wafer pulses is not equal to the state of a corresponding one of the reference pulses.

17. The wafer loading-state inspection method of claim 16, wherein during said detecting, the light emitter is closer to a first side of the carrier, and the light detector is closer to a second side of the carrier opposite the first side, whereby light is transmitted diagonally in the horizontal plane from the light emitter to the light detector of the wafer sensor.

18. The wafer loading-state inspection method of claim 16, wherein during said generating reference pulses, the reference pulses are produced by a photo sensor connected to the wafer sensor, so that as the wafer sensor moves vertically past the carrier the photo sensor moves vertically past a vertical, fixed bar having a plurality of slots spaced at a constant interval.

19. The wafer loading-state inspection method of claim 18, wherein during said generating reference pulses, each slot of the plurality of slots has a vertical length in the range from about 1.9 millimeters to about 2.1 millimeters.

20. The wafer loading-state inspection method of claim 16, wherein during said rotating, the carrier is positioned in an indexer portion of a wafer cleaning apparatus.

* * * * *